United States Patent
Najm et al.

(10) Patent No.: US 7,307,905 B2
(45) Date of Patent: Dec. 11, 2007

(54) LOW LEAKAGE ASYMMETRIC SRAM CELL DEVICES

(75) Inventors: Farid N. Najm, Mississauga (CA); Navid Azizi, Markham (CA); Andreas Moshovos, Athens (GR)

(73) Assignee: The Governing Council of the University of Toronto, Toronto, Ontario (CA)

(*) Notice: Subject to any disclaimer, the term of this patent is extended or adjusted under 35 U.S.C. 154(b) by 28 days.

(21) Appl. No.: 10/524,319

(22) PCT Filed: Aug. 8, 2003

(86) PCT No.: PCT/US03/25084

§ 371 (c)(1),
(2), (4) Date: Feb. 9, 2005

(87) PCT Pub. No.: WO2004/015711

PCT Pub. Date: Feb. 19, 2004

(65) Prior Publication Data

US 2005/0226031 A1 Oct. 13, 2005

Related U.S. Application Data

(60) Provisional application No. 60/402,275, filed on Aug. 9, 2002.

(51) Int. Cl.
*G11C 7/00* (2006.01)
*G11C 11/00* (2006.01)

(52) U.S. Cl. .................. 365/205; 365/154

(58) Field of Classification Search ......... 365/154, 365/210, 205, 202, 189.09, 195, 230.05, 365/207, 208, 214; 327/57
See application file for complete search history.

(56) References Cited

U.S. PATENT DOCUMENTS

| | | | |
|---|---|---|---|
| 5,144,582 A | | 9/1992 | Steele |
| 5,355,333 A | | 10/1994 | Pascucci |
| 5,363,328 A | | 11/1994 | Browning, III et al. |
| 5,583,821 A | | 12/1996 | Rose et al. |
| 5,608,581 A | | 3/1997 | Potma |
| 5,742,552 A | * | 4/1998 | Greenberg ............... 365/210 |
| 5,744,411 A | | 4/1998 | Zhao et al. |
| 5,949,256 A | * | 9/1999 | Zhang et al. ............... 327/57 |
| 6,188,628 B1 | * | 2/2001 | Tomotani ................ 365/226 |
| 6,198,656 B1 | | 3/2001 | Zhang |
| 6,275,433 B1 | | 8/2001 | Forbes |

(Continued)

*Primary Examiner*—Richard T. Elms
*Assistant Examiner*—Douglas King
(74) *Attorney, Agent, or Firm*—Moore & Van Allen, PLLC; Steven B. Phillips

(57) ABSTRACT

Asymmetric SRAM cell designs exploiting data storage patterns found in ordinary software programs wherein most of the bits stored are zeroes for data and instruction streams. The asymmetric SRAM cell designs offer lower leakage power with little impact on latency. In asymmetric SRAM cells, selected transistors are "weakened" to reduce leakage current when the cell is storing a zero. Transistor weakening may be achieved by using higher voltage threshold transistors, by varying transistor geometries, or other means. In addition, a novel sense amplifier design is provided that leverages the asymmetric nature of the asymmetric SRAM cells to offer cell read times that are comparable with conventional symmetric SRAM cells. Lastly, cache memory designs are provided that are based on asymmetric SRAM cells offering leakage power reduction while maintaining high performance, comparable noise margins, and stability with respect to conventional cache memories.

8 Claims, 8 Drawing Sheets

U.S. PATENT DOCUMENTS

| | | |
|---|---|---|
| 6,317,362 B1 | 11/2001 | Nomura et al. |
| 6,425,056 B2 * | 7/2002 | Meyer ........................ 711/128 |
| 6,466,489 B1 | 10/2002 | Ieong et al. |
| 6,556,472 B2 * | 4/2003 | Yokozeki .................... 365/154 |
| 7,158,402 B2 * | 1/2007 | Houston ..................... 365/154 |
| 2001/0043486 A1 * | 11/2001 | Naffziger et al. ........... 365/154 |
| 2003/0002328 A1 * | 1/2003 | Yamauchi ................... 365/154 |
| 2003/0119265 A1 * | 6/2003 | Kuwazawa ................. 438/275 |

\* cited by examiner

→ Subthreshold Leakage
⋯▶ On Gate Direct Tunneling
→ Edge Directed Tunneling

LOW LEAKAGE ASYMMETRIC SRAM CELL DEVICES

CROSS-REFERENCE TO RELATED APPLICATIONS

This application claims the benefit of previously filed U.S. Provisional Patent Application Ser. No. 60/402,275 filed on Aug. 9, 2002 entitled, "LOW LEAKAGE ASYMMETRIC SRAM CELL, ASSOCIATED NOVEL SENSE AMP, ASSOCIATED SRAM AND CACHE CELL STRUCTURES, AND RELATED METHODS".

FIELD OF THE INVENTION

The present invention relates generally to SRAM (Static Random Access Memory) devices, and more particularly to low leakage power SRAM devices having device performance comparable to conventional SRAM devices.

BACKGROUND

As a result of technology trends and the increased importance of portable electronic devices, leakage (static) power dissipation has emerged as a high priority design consideration in high-performance processor design. Historically, architectural innovations for improving performance relied on exploiting ever larger numbers of transistors operating at higher frequencies. To keep the higher resulting switching power dissipation at bay, successive technology generations have relied on reducing the supply voltage. In order to maintain performance, however, this has required a corresponding reduction in the transistor threshold voltage. Since the Metal Oxide Semiconductor Field Effect Transistor (MOSFET) sub-threshold leakage current increases exponentially with a reduced threshold voltage, leakage power dissipation has grown to be a significant fraction of overall chip power dissipation in modern, deep-submicron (<0.18 pm) processes. Moreover, it is expected to grow by a factor of five every newer chip generation. For processors it is estimated that in 0.1 µm technology, leakage power will account for about 50% of the total chip power.

Since leakage power is proportional to the number of transistors, and given the projected large memory content of future System-on-Chip (SOC) devices, it becomes important to focus on Static Random Access Memory (SRAM) structures such as caches, which comprise the vast majority of on-chip transistors in some systems. Existing circuit-level leakage reduction techniques are oblivious to program behavior, such as how many bits to be stored will be high or low, and trade off performance for reduced leakage where possible. Combined circuit and architecture-level techniques reduce leakage for those parts of the on-chip caches that remain unused for long periods of time (for example, such as for thousands of cycles). The mechanisms that identify which cache parts will be unused and that enable leakage reduction incur considerable power and performance overheads that have to be amortized over long periods of time. As a result, these methods are not effective when most of the cache is actively used.

There is a need for SRAM storage with reduced leakage power while having comparable performance characteristics. As such, power consumption may be minimized while still providing the performance required in new generation systems and consumer devices.

SUMMARY

The present invention seeks to satisfy at least some of the above unmet needs. Embodiments of the present invention include a family of improved asymmetric SRAM cell designs that can be used in new SRAM and cache memory designs referred to as the Asymmetric-Cell Caches (ACC). ACCs offer drastically reduced leakage power compared to conventional caches even when there are few parts of the cache that are left unused. ACCs exploit the fact that in ordinary programs most of the bits in caches are zeroes for both the data and instruction streams. It has been shown that this behavior persists for a variety of programs under different assumptions about cache sizes, organization and instruction set architectures, even when assuming perfect knowledge of which cache parts will be left unused for long periods of time.

Conventional SRAM cells are symmetrically composed of transistors with comparable leakage and threshold characteristics. The asymmetric SRAM cell designs of the present invention offer low leakage with little or no impact on latency. In asymmetric SRAM cells, selected transistors are "weakened" with respect to other transistors used in SRAM cells to reduce leakage power when the cell is storing a zero binary state (the most common case). Transistor weakening may be achieved by using higher voltage threshold ($V_t$) transistors, by varying transistor sizes, combinations of these approaches, or other means.

In addition to improved SRAM designs, the present invention also describes a novel sense amplifier (SA) design that exploits the asymmetric nature of our cells to offer cell read times that are comparable with conventional symmetric SRAM cells. Moreover, an embodiment of the present invention further presents a cache memory design based on ACCs that when compared to a conventional cache, the cache memory architecture of the present invention offers leakage reduction while maintaining high performance and comparable noise margins and stability.

In one embodiment of the present invention there is disclosed an asymmetric SRAM cell for storing a binary variable. The asymmetric SRAM cell exhibits reduced leakage power with respect to a comparable symmetric SRAM cell when the asymmetric SRAM cell stores a binary variable representing a predetermined binary value, such as a binary one or binary zero. The asymmetric SRAM cell is made up of a plurality of transistors of a first and second type operably coupled and configured as an asymmetric SRAM cell. At least one of the second type of transistor is made weaker than at least one of the first type of transistor. The two types of transistors are then variously configured such that the asymmetric SRAM cell achieves reduced leakage power with respect to a symmetric SRAM cell having the first type of transistor only.

The second type of transistor can be made weaker than the first type of transistor in various ways. One way is to increase the voltage threshold as compared to the voltage threshold of the first type of transistor. Another way is to decrease the channel width as compared to the channel width of the first type of transistor. Yet another way is to increase the channel length as compared to the channel length of the first type of transistor. Further, combinations of the above ways to make transistors relatively weaker, as well as other ways to make transistors relatively weaker may be used.

In another embodiment of the present invention there is disclosed a sense amplifier (SA) that exploits the characteristics of the asymmetric SRAM cell. A sense amplifier is coupled with an asymmetric SRAM cell and provides faster access times when the asymmetric SRAM cell stores a first predetermined binary value. The sense amplifier is comprised of a first pair of cross coupled inverters across a bitline (BL) and a bitline bar (BLB) and a second pair of cross coupled inverters operably coupled with the first pair of cross coupled inverters. This is conventional up to this point. The present invention sense amplifier further includes a plurality of additional transistors forming a dummy column of cells that store a second predetermined binary value at all times wherein during a read operation of the SRAM cell one of the dummy cells will have its wordline asserted. The dummy column of cells are operably coupled with the first pair of cross coupled inverters. The sense amplifier is driven by four inputs operably coupled with a subset of transistors. The inputs include the BL and BLB that derive from the SRAM cell, as well as a dummy bit line (D), and a dummy bitline bar (DB). The D and DB are input to the dummy cells such that D is input to the sense amplifier on the same side as BLB while DB is input to the sense amplifier on the same side as BL.

Moreover, the transistors coupled with BL and BLB have higher transconductance characteristics than the transistors coupled with D and DB. This is achieved either by varying the threshold voltage or altering the size of the transistor channel widths or channel lengths.

In yet another embodiment of the present invention there is disclosed an SRAM device comprised of an array of SRAM cells wherein each SRAM cell stores a binary variable representing a predetermined binary value. In addition, each SRAM cell is an asymmetric SRAM cell having reduced leakage power with respect to a comparable symmetric SRAM cell as previously described. The SRAM device can be configured as a direct store SRAM device, a selectively inverted SRAM device, or a cache memory device. If the SRAM device is a cache memory device then it can either be configured as a direct store cache memory or a selectively inverted cache memory.

DETAILED DESCRIPTION

Ideally, an SRAM cell should be fast and should dissipate low leakage power. This is increasingly at odds with the fundamental technology trade off between transistor speed and leakage. Conventional high performance SRAM cells use a symmetric configuration of six transistors with comparable threshold voltages. One can reduce leakage by using higher Vt transistors, but unfortunately using an all high Vt transistor cell degrades performance by an unacceptable margin.

The goal of the asymmetric SRAM cells of the present invention is to reduce leakage while maintaining high performance based on the following approach: select a preferred state and weaken only those transistors necessary to drastically reduce leakage when the cell is in that state. These cells exhibit asymmetric leakage and access behavior. Fortunately, their asymmetric access behavior can be exploited to maintain high performance while reducing leakage.

For purposes of illustration, the following convention will be used. A high Vt (HV) transistor is obtained from a basic 0.13 μm, 1.2V, transistor (referred to herein as the regular Vt (RV) transistor) by artificially increasing the Vt by 0.2V. 0.2V was chosen because it leads to a difference of about 10 times between the leakage currents of HV and RV transistors, which is typical of dual Vt technology. Those of ordinary skill in the art will realize that other relative changes to Vt can be implemented. The data values illustrated herein are but one example chosen to illustrate the results of the present invention when the asymmetric concept is applied. For illustration purposes, A "high Vt transistor" as used herein is defined as a transistor having a relatively higher "Vt" or threshold voltage than other transistors typically used in an SRAM cell design. The reason for selecting transistors having a higher Vt than others within the SRAM cell is to reduce the leakage current and thereby reduce an SRAM cell's leakage power. Although the high Vt transistor example described herein has a threshold voltage (Vt) which is 0.2 volts higher, this is only an example for a 1.2 volt, basic, 0.13 micron transistor. Different shifts of Vt could be used, using either higher or lower Vt differential voltages, so long as the leakage current draw is reduced as required for a given SRAM cell design or application. Additionally, transistors in technologies other than the basic 0.13 micron example can be used.

Moreover, the present invention has been described and illustrated using MOSFET type transistors. Those of ordinary skill in the art can appreciate that other types of transistors and the like can be substituted for MOSFETs.

Figure 1:
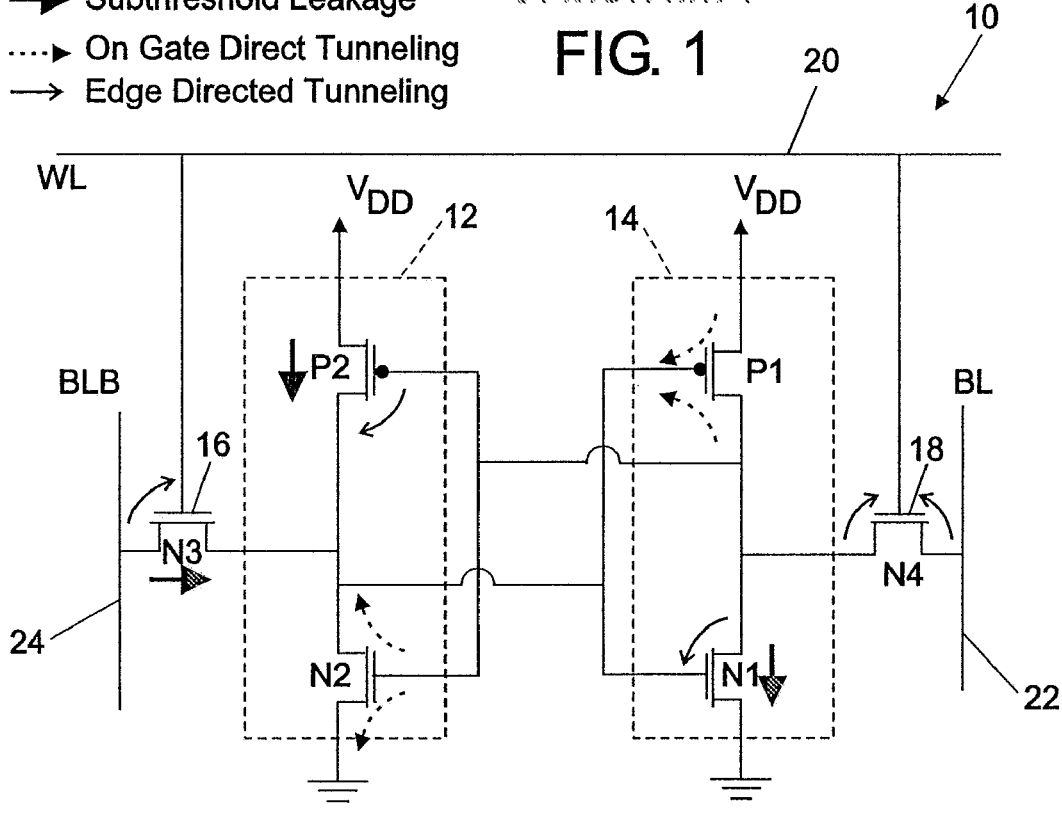
FIG. 1 illustrates an example circuit diagram of a conventional six transistor SRAM cell.

FIG. 1 illustrates a conventional SRAM cell 10 comprised of two inverters 12, 14, (P2, N2) and (P1, N1), and two pass transistors 16, 18, N3 and N4. In the inactive state, a wordline (WL) 20 is held low so that the two pass transistors 16, 18 are off isolating the cell from a bitline (BL) 22 and bitline-bar (BLB) 24. At this stage the bitlines 22, 24 are also typically charged at $V_{DD}$ (e.g., logic '1'). Cells spend most of their time in the inactive state. In this state, most of the leakage is dissipated by the transistors that are off and that have a voltage differential across their drain and source. The value stored in the cell (i.e., the cell state) determines which transistors these are. When the cell is storing a '0', as in FIG. 1, the leaky transistors are P1, N4 and N2. If the cell were storing a '1' then transistors P2, N1 and N3 would dissipate leakage power. A simple technique for reducing leakage power would be to replace all transistors with high-Vt ones, but this unacceptably degrades the bitlines discharge times by 61.6%.

Figure 2:
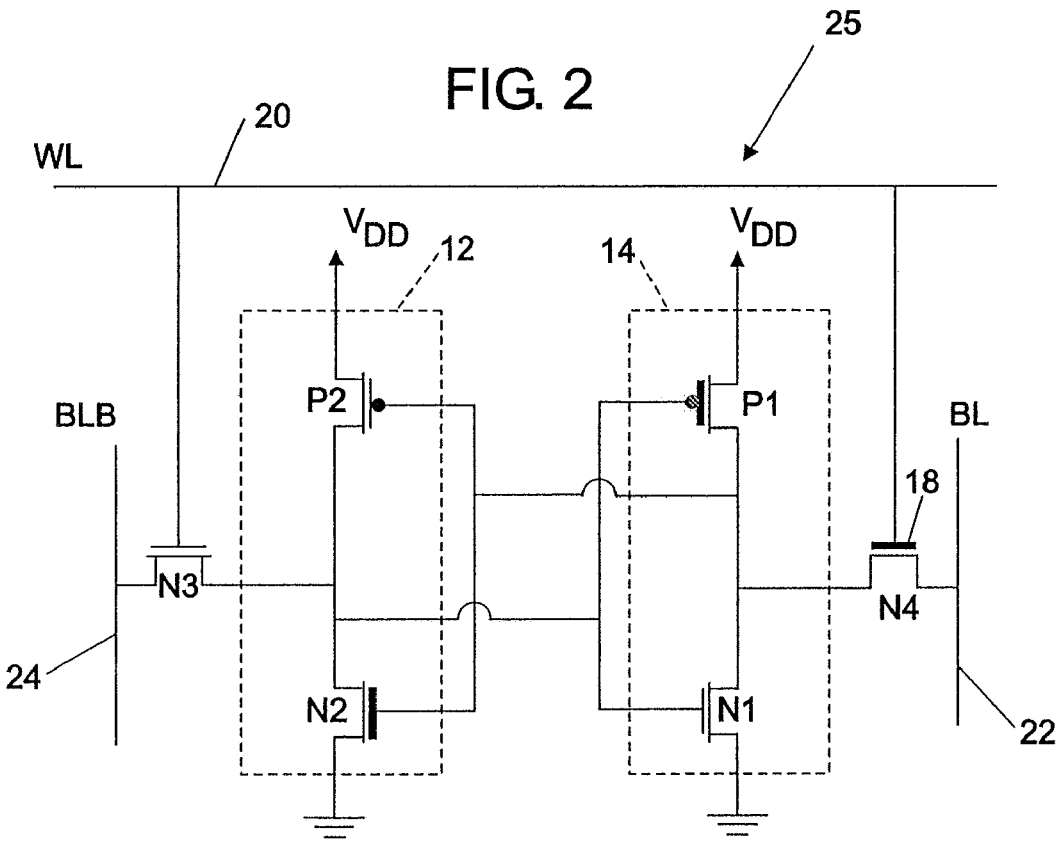
FIG. 2 illustrates a circuit diagram of basic asymmetric SRAM cell, according to one embodiment of the present invention.

Since ordinary programs exhibit a strong bias in cache-resident bit values, another possibility to reduce leakage power, but at the same time keep read access times short, is to choose a preferred stored value and to only replace those transistors that contribute to the leakage power in this state with HV transistors. This is illustrated in FIG. 2 where P1, N4 and N2 have been made weaker with respect to P2, N1, and N3. This basic asymmetric SRAM cell 25 was simulated and exhibits the same leakage as the RV cell 10 of FIG. 1 when holding a logic '1', but its leakage is reduced by 70× when holding a logic '0.'

The read access time of the basic asymmetric cell is, however, degraded. Due to N2's and N4's higher threshold voltage, the bitline discharge takes longer. The discharge times for BLB and BL are 12.2% and 46.4% longer than the discharge time for the RV cell, respectively. Discharge time is defined as the time from when the wordline is raised to when one of the bitlines reduces to 90% of its precharge value. The number 90% was chosen due to it being an appropriate differential signal for sense amplifiers to trigger.

Figure 3:
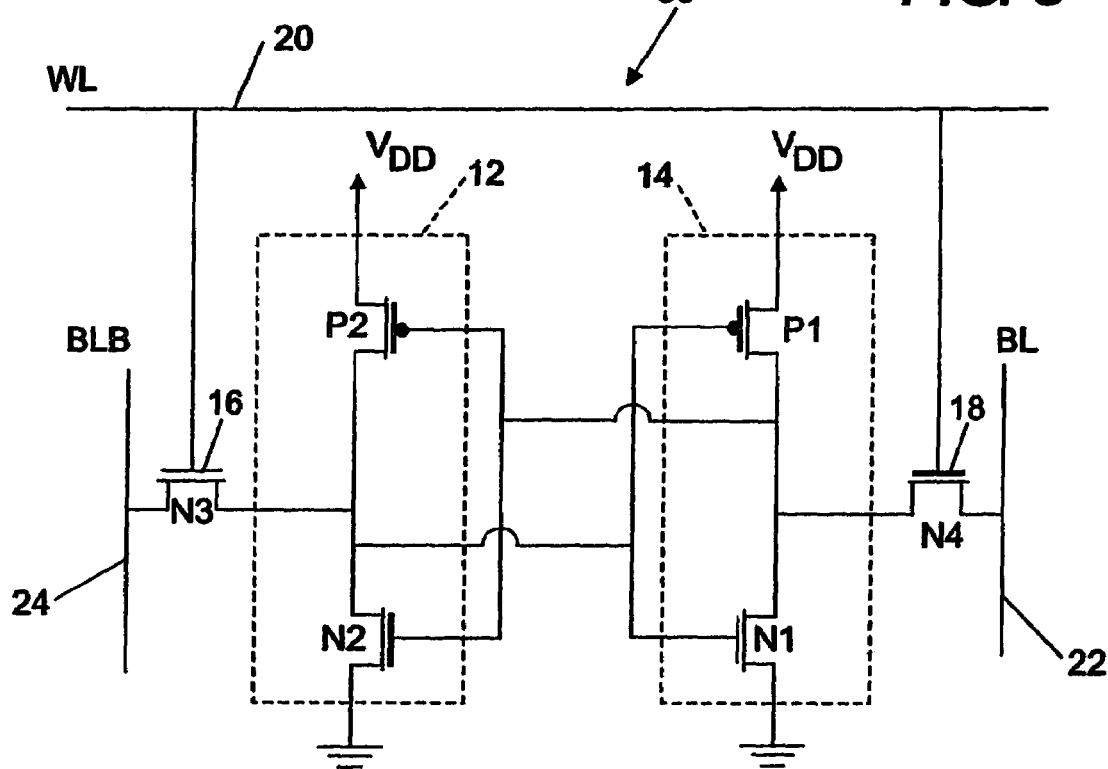
FIG. 3 illustrates a circuit diagram of an asymmetric SRAM cell configured to address leakage, according to one embodiment of the present invention.

P-Channel Metal Oxide Semiconductor (PMOS) transistors have very little effect on a cell's read access time because the role of pulling down the bitlines is played by the two n-channel Metal Oxide Semiconductor (NMOS) transistors on the side of the cell storing the '0'. Thus, a better asymmetric cell can be configured using the basic asymmetric cell of FIG. 2 with P2 also set to high Vt. This cell, shown in FIG. 3, is referred to as the Leakage Improved 2 (LI2) cell 30 and has the advantage of partially reduced leakage in the high leakage state. When the cell is holding a logic '1' its leakage is reduced by 1.6× relative to the RV cell, and when holding a logic '0' its leakage is reduced by 70×. The discharge times for BLB and BL are 12.2% and 46.4% longer than the discharge times for the RV cell, respectively, the same as the basic asymmetric cell's discharge times.

Figure 4:
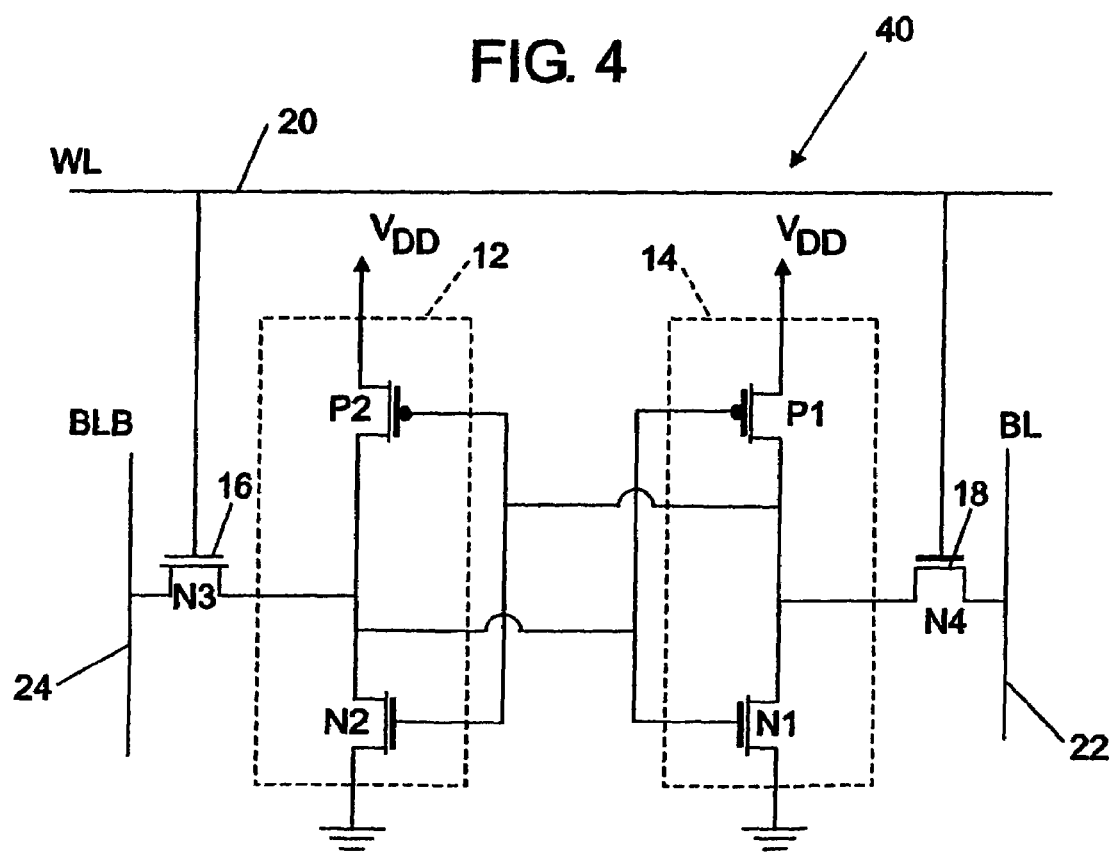
FIG. 4 illustrates a circuit diagram of an asymmetric SRAM cell configured to address leakage, according to one embodiment of the present invention.

A further improvement is possible since by using a sense amplifier (described below) that matches the read time on the slow side of the cell to the fast side, there is no need for N1 to be low Vt. This leads to the cell in FIG. 4, referred to as the Leakage Improved 3 (LI3) cell 40 or leakage enhanced (LE) cell 40. This cell further reduces leakage in the high leakage state, so that its leakage relative to the RV cell 10 is reduced by 7× in the '1' state and by 70× in the '0' state. The BL discharge time is now 61.6% longer than the discharge time for the RV cell 10, but that is of minor importance due to the novel sense amplifier design, as we will see later. The two asymmetric cells, LI2 30 and LI3 40, take the basic asymmetric cell 25 of FIG. 2 and improve its leakage performance without affecting its read access time.

Figure 5:
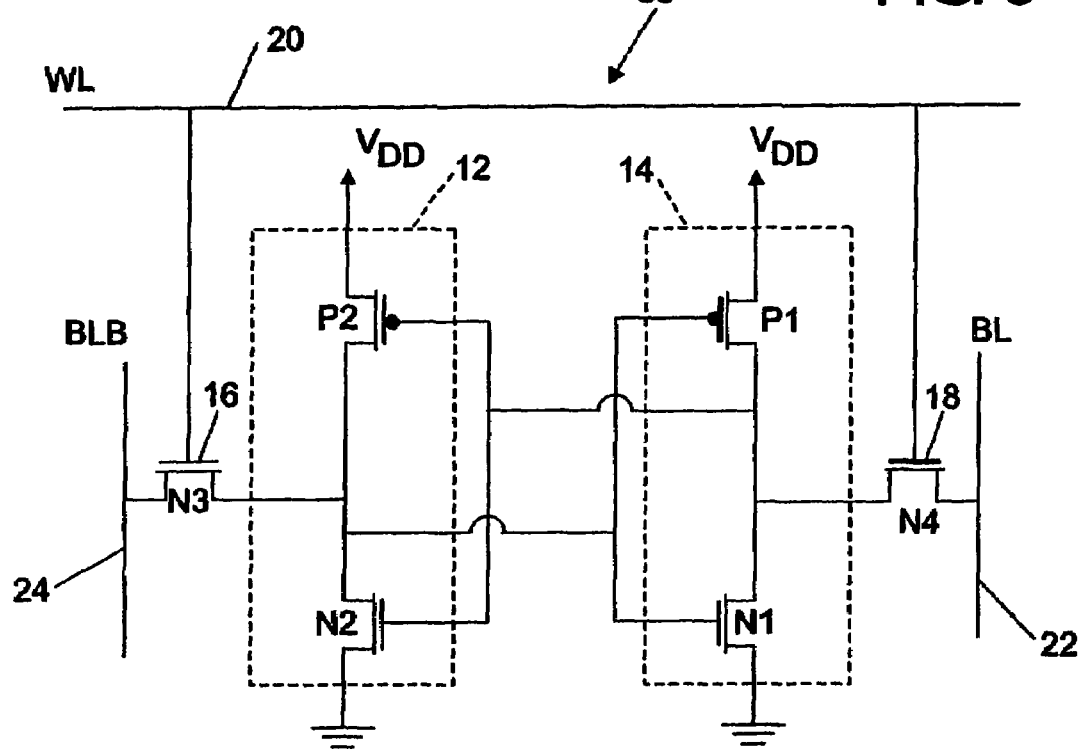
FIG. 5 illustrates a circuit diagram of an asymmetric SRAM cell configured to address leakage and speed, according to one embodiment of the present invention.

Another design challenge is to take the basic asymmetric cell 25 and improve its read access time while keeping some of the leakage benefits of the basic asymmetric cell 25. To eliminate the speed penalty incurred in the basic asymmetric cell 25 due to both pull-down paths having one high Vt transistor, both N2 and N3 are kept at low Vt while P1 is made high Vt. This cell is shown in FIG. 5 and is termed the Speed Improved 1 (SI1) cell 50. The SI1 cell 50 has discharge times for BLB and BL which are 0% and 46.7% respectively longer than the RV cell 10. Thus one side of the cell is just as fast as the RV cell 10. However, this cell suffers from higher leakage than the basic asymmetric cell 25, with a leakage reduction of 2× relative to RV cell 10 when holding a '0', and no leakage reduction when holding a '1'.

Figure 6:
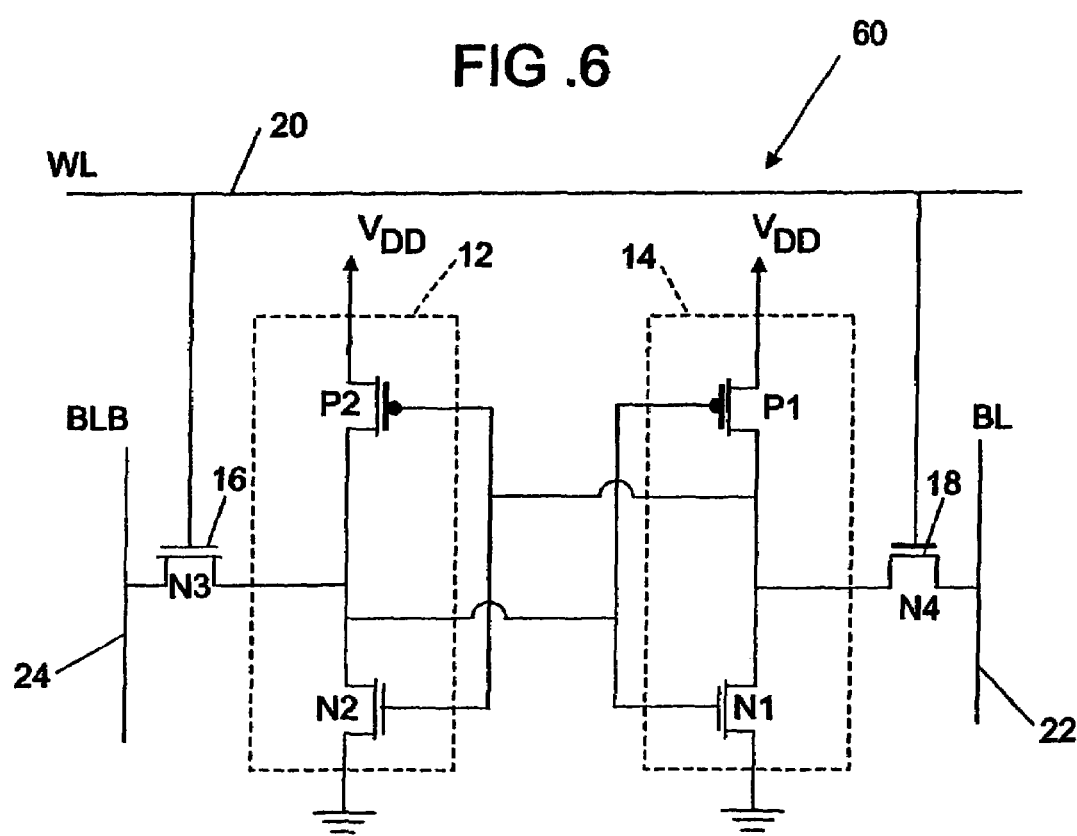
FIG. 6 illustrates a circuit diagram of an asymmetric SRAM cell configured to address leakage and speed, according to one embodiment of the present invention.
Figure 7:
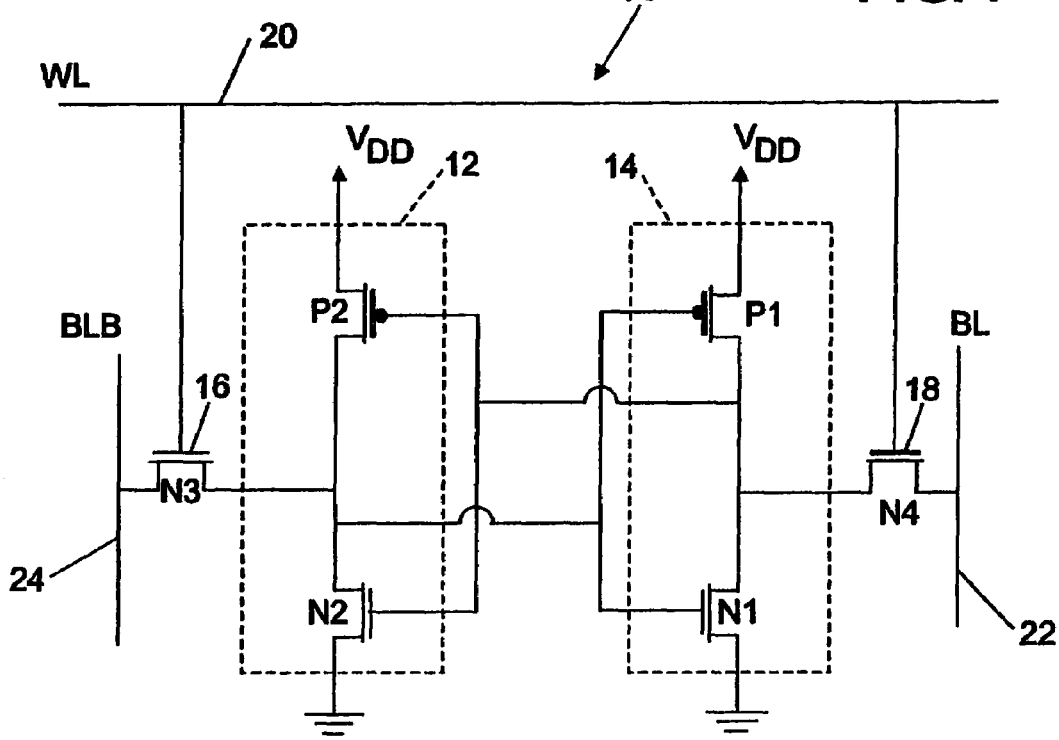
FIG. 7 illustrates a circuit diagram of an asymmetric SRAM cell configured to address leakage and speed, according to one embodiment of the present invention.

The same transformations performed on the basic asymmetric cell 25 to improve its leakage performance can also be performed on the SI1 cell 50. First, P2 is made high Vt (FIG. 6), and then N1 is also made high Vt (FIG. 7). These two new cells are named Speed Improved 2 (SI2) 60 and Speed Improved 3 (SI3) 70, respectively. The SI2 cell 60 has leakage reductions of 2× and 1.6× when storing a '0' and '1', respectively, while the SB cell 70 has leakage reductions of 2× and 7×. The SI3 cell 70 is also referred to as the Speed Enhanced (SE) cell 70.

These two cells have no read access time degradation compared to the RV cell 10 along BLB, but have a 46.5% and 61.6% degradation along BL respectively. Once again, the degradation along BL is of minor importance due to the novel sense amplifier.

Note that the SE cell 70 reverses the preferred leakage state to the state when the cell is holding a '1'. All further references to this cell will have the '1' state as the preferred state so that the cell language remains in conformity with other cells. It should be noted that in practice the cell bitlines can be flipped to allow for '0' to be the preferred state without affecting any of the performance or stability results shown here.

Figure 8:
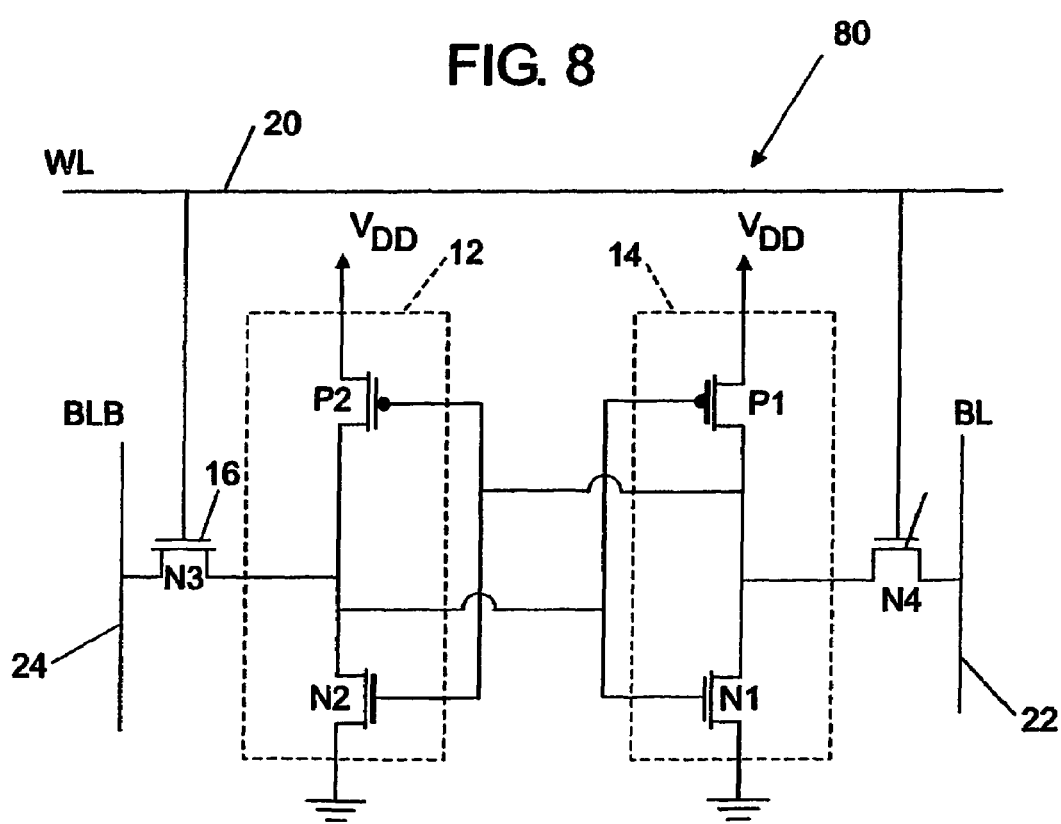
FIG. 8 illustrates a circuit diagram of an asymmetric SRAM cell termed a special precharge cell, according to one embodiment of the present invention.

One would like to combine the low leakage of the LI2 30 and LE 40 cells with a very small read access delay. Yet another asymmetric cell addresses these objectives, but it requires a different read operation. In the steady state, instead of keeping BL precharged to $V_{DD}$, it is kept at ground. Now, N4 18 can be kept low Vt for the preferred '0' state. This is termed the Special Precharge (SP) cell 80 and it is shown in FIG. 8. This asymmetric cell requires changes to the peripheral circuits of the SRAM array. Nevertheless, the results for this cell indicate that leakage is reduced by 83.3× in the '0' state, while the '1' state shows no leakage reduction. Bitline discharge times are degraded by 12.2% and 0%, respectively, for this example.

Until now, only the bitline discharge times of the different cells have been compared, and write times have been ignored. The write times of the cells are less important because stronger write drivers can be designed to drive the bitlines, and write drivers are a small portion of the total SRAM. The write times of the asymmetric cells all lie within the write times of the RV cell and the HV cell.

The LE cell 40 and SE cell 70 are the two best designs from the two sets of asymmetric cells as indicated by test results. Therefore, only these two cells, and variations on them, will be referenced in the remainder of this description.

Another major consideration with the cell design is its stability. There are two interrelated issues: read stability and noise margins. Read stability indicates how likely it is to invert the cell's stored value when it is being accessed. This is computed as the ratio of $I_{trip}/I_{read}$, where $I_{trip}$ is the current through the pull-down NMOS when the state of the cell is being reversed by injecting an external current $I_{test}$, and where $I_{read}$ is the maximum current through the pass transistor during a read.

The static noise margin (SNM) of an SRAM cell is defined as the minimum DC noise voltage necessary to flip the state of the cell. For the present invention, the stability of all cells was measured by simulation via both the Static Noise Margin (SNM) and the $I_{trip}/I_{read}$ methods. Under both stability tests, the stability was first measured under nominal conditions, assuming no process variations. Then, to measure stability under process variations, two sets of tests were performed. First, the SNM and $I_{trip}/I_{read}$ tests were performed on 59,049 combinations of different Vt and length variations for all six transistors in the cell. The combinations included modifying by $\{-3\sigma, 0, 3\sigma\}$ the NMOS transistors' Vt and length values and the PMOS transistors' Vt value. The worst case value for various cells was found, and compared to the worst-case value obtained for the RV cell.

Second, Monte-Carlo analysis was performed to obtain a distribution for the SNM and $I_{trip}/I_{read}$. For each cell, 500 scenarios for Vt and channel length were randomly generated, consistent with their joint distributions, and simulated. The mean of the distribution was estimated using the unbiased estimator in (1), and the variance was estimated by using the unbiased estimator in (2). Furthermore, the Normal Scores Method was used to graphically determine the distribution type. Given the distribution type, mean, and variance, the probability of failure for various cells was then computed.

The SNM of the LE 40 and SE 70 cells were computed through simulation. The SNM of the RV cell 10 was also computed to be used as a reference. Under nominal conditions, the SNM of the LE 40 and SE 70 cells were 0.246V and 0.221V, respectively, while the SNM of the RV cell 10 was 0.250V. Thus, the LE cell 40 and SE cell 70 show a decrease in SNM of 1.6% and 11.7%. One would expect that by using higher threshold voltage transistors in the design, the SNM of the cells would increase, but the asymmetry of the cells skews the lobes of the butterfly curve and decreases the SNM, as will be explained below.

First, let us examine the SNM of the cells when the wordline is not active. During this state, the SRAM cell is not as vulnerable as when it is being read, but a study of this case helps to understand the decrease in the SNM when the cell is being read. When the wordline is off, the only transistors that affect the SNM are the four transistors comprising the back-to-back inverters.

Since the four internal transistors of the LE cell 40 are all high Vt, the cell has equal low and high noise margins of 0.685V, a 22.6% increase over the standby SNM of the RV cell, 0.559V. However, when the SNM of the cell is being measured during a read the cell has high SNM in one state, 0.363V, and low SNM in the other, 0.246V. The asymmetry in the LE butterfly curve is due to the mismatch between the strength of the pass-gate (N3) and pull-down (N2) transistors. During a read, the N3 pass transistor 16, due to it being low Vt, has a higher conductivity than N2 and raises the voltage at the storage node to a higher voltage than if the two NMOS were of equal strength.

For the SE cell 70, the internal inverter pair are different. Thus the standby (i.e., with the wordline off) SNM of the cell has asymmetric lobes with noise margins of 0.535V and 0.727V, in the worst case a 4.2% decrease in noise margin compared to the RV cell. The source of this mismatch is the Vt difference between N1 and N2, which causes one of the transfer characteristics to commence its transition in the SNM plot from '0' to '1' later than normal. During a read, the mismatch between the size of the lobes becomes exaggerated because it is as if a constant is subtracted from the noise margin on each side of the cell since each side of the cell has equal strength pass transistors and pull-down transistors. While being read, the SE cell 70 has low and high noise margins of 0.222V and 0.365V respectively.

The asymmetric cells' stability performance degrades compared to that of the RV cell. Since process variations induce an asymmetry in the butterfly curve, the original asymmetry inherent in the butterfly curves for the LE 40 and SE 70 cells allows one lobe of the butterfly curve to become pinched off even further and lose stability. For the LE cell 40 the butterfly curve becomes pinched off when N3 becomes stronger than N2 and P1 increases in strength, while N1 does not. The worst case for the SE cell 70 occurs at a different process corner. The butterfly curve becomes pinched off when P2 decreases in strength and N2 increases in strength, and N4 gets stronger than N1.

Monte-Carlo Analysis was also performed on the RV 10, LE 40 and SE 70 cells. The Normal Scores method reveals that the distributions for all cells were Gaussian. Due to their very small standard deviation, the SNM of all cells remains very close to their respective mean average. Thus the mean of the SNM becomes a very important measure, and is a better reflection of the stability than the nominal or worst-case SNM. Using the mean as a measure of stability, the LE cell 40 has a 7% increase in SNM and the SE cell 70 has a 5.8% decrease.

Using the SNM as a measure of stability showed that the LE cell 40 was comparable to the RV cell 10 while the SE cell 70 showed a marginal decrease in stability. When $I_{trip}/I_{read}$ is computed by simulation, it is seen that the SE cell 70 outperforms the RV cell 10 and the LE cell 40 suffers.

The LE cell 40 has a lower $I_{trip}/I_{read}$ value due to the Vt mismatch between the pass transistor and pull-down transistor on one side of the cell. The $I_{trip}$ values from both sides of the cell show a drop compared to the $I_{trip}$ value from the RV cell 10 due to both pull-down transistors becoming high Vt. However, with N3 16 remaining low Vt, $I_{read}$ on the fast side of the cell does not suffer the same drop, and $I_{trip}/I_{read}$ falls compared to that of the RV cell 10.

The SE cell 70, due to it having the same strength pull-down and pass transistors 16, 18 on each side of the cell, does not experience the same problem as the LE cell 40. On the slow side of the cell, both $I_{trip}$ and $I_{read}$ fall compared to the RV cell 10, but $I_{read}$ falls by a larger amount thus increasing the $I_{trip}/I_{read}$. On the fast side of the cell, $I_{read}$ does not change compared to the RV cell 10, but $I_{trip}$ increases slightly. In the RV cell 10, the reduction in voltage (due to leakage) at the stored '1' node degrades the current sinking capacity of the pull-down NMOS. In the SE cell 70, because of the high Vt transistors on the '1' side of the cell there is no degradation in the current sinking capacity of the pull-down transistor and thus $I_{trip}$ increases leading to a larger $I_{trip}/I_{read}$.

A total of 59,049 different corner cases of process variations were simulated and the worst case $I_{trip}/I_{read}$ was noted in each cell. The LE cell 40 and the RV cell 10 achieve their worst-case $I_{trip}/I_{read}$ for the same process corner: when the difference in strength between N2 and N3 is amplified with N2 becoming weaker, and N3 16 becoming stronger. The SE cell 70, however, suffers its worst-case $I_{trip}/I_{read}$ when N4 18 becomes stronger than N1.

Monte-Carlo analysis show that $I_{trip}/I_{read}$ is also Gaussian from the linear plots obtained from the Normal Scores Method. The standard deviation is very small and most cells will be very near the mean where the LE shows a 4.35% decrease and the SE cell 70 shows a 14.84% increase in $I_{trip}/I_{read}$.

Figure 9:
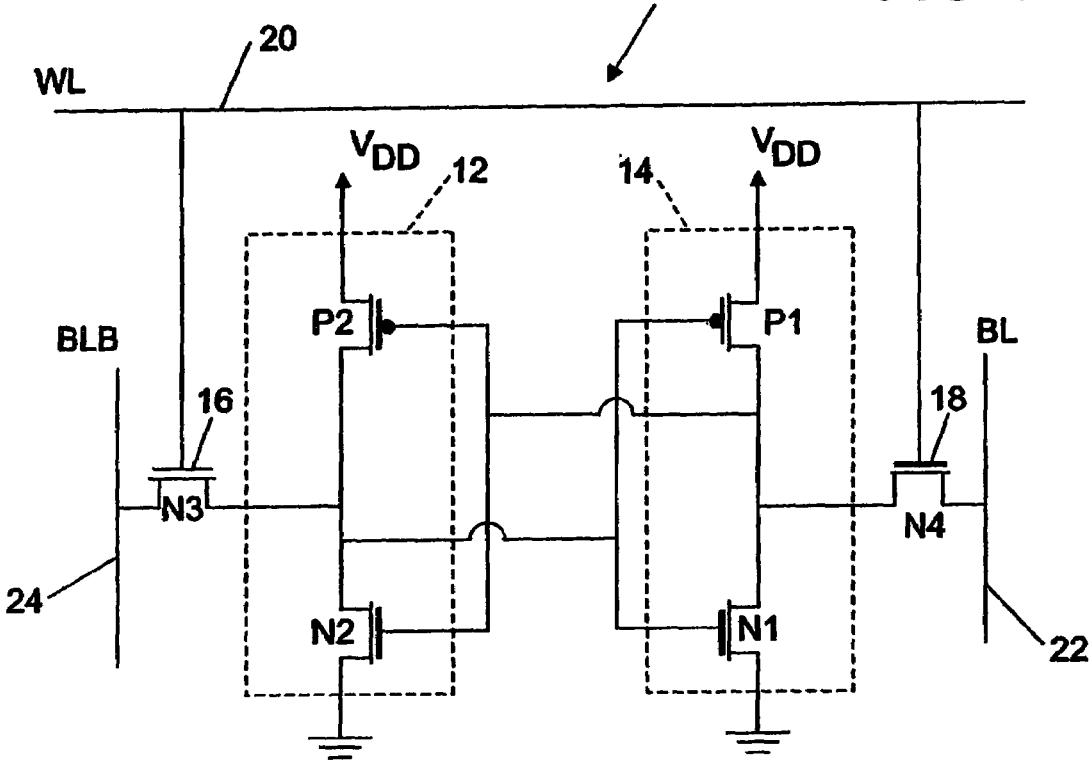
FIG. 9 illustrates a circuit diagram of an asymmetric SRAM cell termed a stability leakage enhanced cell, according to one embodiment of the present invention.
Figure 10:
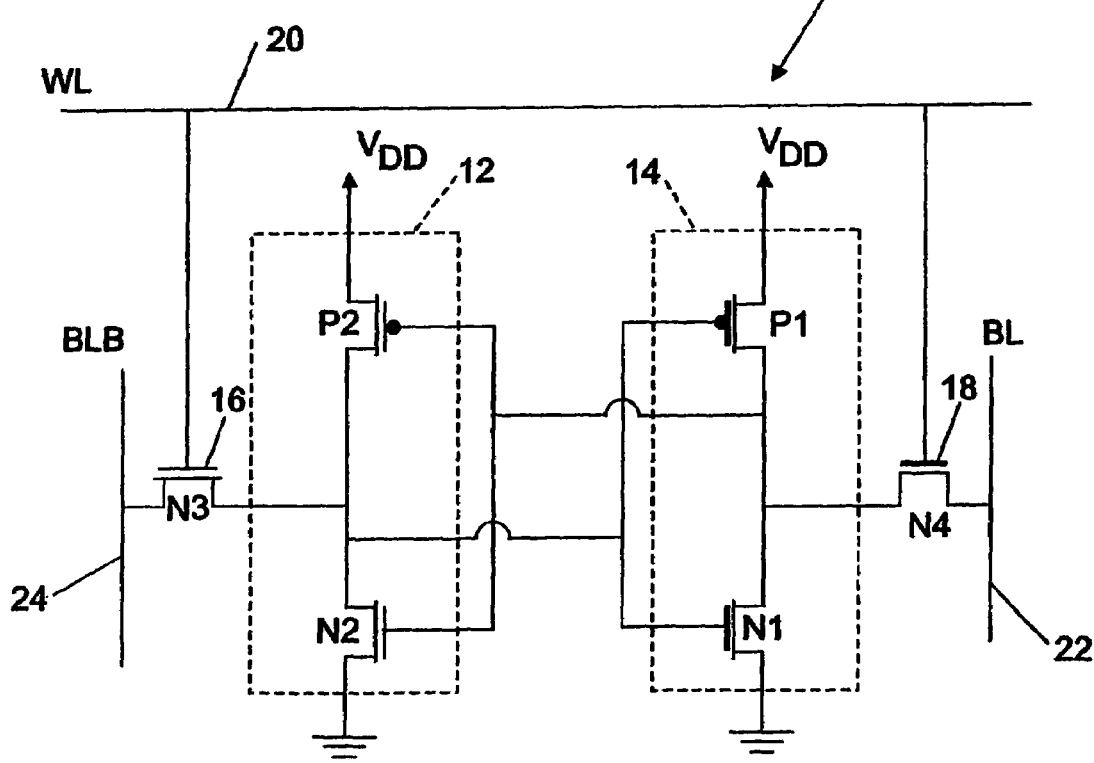
FIG. 10 illustrates a circuit diagram of an asymmetric SRAM cell termed a stability speed enhanced cell, according to one embodiment of the present invention.

The SE 70 and LE 40 cells have either a lower stability in the SNM test or the $I_{trip}/I_{read}$ test. In many cases, the stability of the cell is a critical factor to obtain a desired yield and to lower the cost of the chip. In that regard, two derivative cells, one from the LE cell 40 and one from the SE cell 70, have been developed that improve upon their SNM, but do not decrease the leakage as much as the SE 70 and LE 40 cells. The two new cells are named Stability-Leakage Enhanced (SLE) 90 and Stability-Speed Enhanced (SSE) 100 and are illustrated in FIGS. 9 and 10 respectively.

One way to improve the SNM of the cells under process variations is to try to make the size of the lobes of the butterfly curve symmetric. For the LE cell 40 the lobes can be made more symmetric by making N2 low Vt, but this new cell would just be the SE cell 70. Another option is to make P1 low Vt. This change, shown in FIG. 9, makes the lobes of the butterfly curve more symmetric. The SNMs are now 0.360V and 0.283V instead of 0.363V and 0.246V. To make the SE cell's 70 SNM plot more symmetric, P2 can be made low Vt yielding SNMs of 0.256V and 0.362V instead of 0.222V and 0.366V.

For these stability improved cells, all the previous tests for leakage, performance, and stability can be performed to compare them to the cells they were derived from, as well as to the RV cell 10.

The leakage performance of the stability improved SLE 90 and SSE 100 cells falls off, as expected due to one transistor in the LE 40 and SE 70 cells being re-converted to a low Vt transistor. For the SLE cell 90, the leakage reduction when holding a '1' remains unchanged at a 6.96× reduction relative to RV cell 10, but the leakage reduction when holding a '0' changes from 69.5× to 2.5×. For the SSE cell 100, when it is holding a '0' the leakage reduction stays at 2.04×, but when it is holding a '1' the leakage reduction changes from 6.96× to 1.91×.

Since the PMOS transistors do not play a large role in discharging the bitlines, it would be expected that the discharge time for the stability improved cells to be very close to the cells they derived from. Through simulation, it is seen that the discharge times along BL and BLB remain almost constant. As for the write times, SLE cell's 90 write time decreases to a 33.15% increase over RV cell's 10 write time from LE cell's 40 35.95% increase. The SSE cell's 100 write time jumps to a 49.22% increase over the RV cell's 10 write times.

A stability analysis has also been performed on the derivative cells for both the SNM and $I_{trip}/I_{read}$. Both derivative cells perform better than the RV cell 10 in the worst case, and under Monte-Carlo analysis. Under the $I_{trip}/I_{read}$ method, there is very little change, because $I_{trip}/I_{read}$ depends strongly on the NMOS transistors, which have not been changed, but the stability-improved cells perform slightly worse than the cells from which they were derived.

It has been shown that when stability is recovered through a change in threshold voltage of the PMOS transistors, a large portion of the leakage benefits of the asymmetric cells are lost. Furthermore, the $I_{trip}/I_{read}$ of the LE cell 40 could not be improved by threshold voltage assignment. Another way of improving stability is to resize some of the transistors to reclaim the conductance lost due to the high Vt assignment. This change does not have a large effect on the leakage characteristics because leakage increases exponentially with reduced threshold voltages, but increases only linearly with transistor size. Moreover, the low $I_{trip}/I_{read}$ of the LE cell 40 can be improved by transistor resizing.

Figure 11:
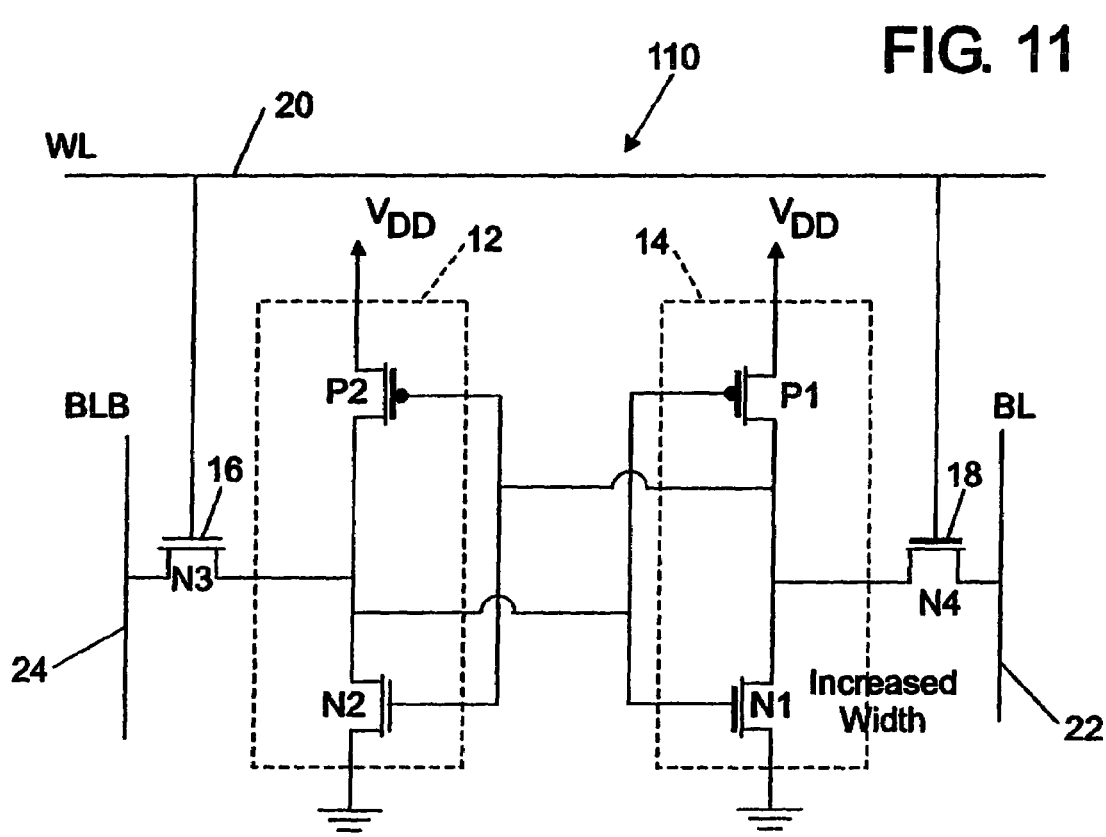
FIG. 11 illustrates a circuit diagram of an asymmetric SRAM cell configured to address leakage through differences in transistor sizing, according to one embodiment of the present invention.

The lobes of the SNM plot for the SE cell 70 can be made more symmetric by making N1 wider. In our case, we increased the width of this transistor by 26%, leading to a new cell shown in FIG. 11 and referred to as Resized Speed Enhanced (RSE) 110. The SNM for the RSE cell 110 is comparable to that of the RV cell 10 and the change in N1's size leads to an increase of only 2.9% in cell area The SNM margins are now 0.253V and 0.347V instead of 0.222V and 0.366V. The RSE cell's 110 nominal value for $I_{trip}/I_{read}$ does not change much compared to the nominal value for the SE cell 70. On the slow side of the cell, which had the higher $I_{trip}/I_{read}$ value for the SE cell 70, the increase in N1's size allows for $I_{trip}$ to become larger and increases the $I_{trip}/I_{read}$ value. The fast side of the cell however, which has the limiting $I_{trip}/I_{read}$ value, has a reduced $I_{trip}$ that reduces the final value of $I_{trip}/I_{read}$ to 2.53. The reduction in $I_{trip}$ is due to the '1' storage node having a slightly lower voltage due to the increased leakage through N1. Nevertheless, the RSE cell's 110 $I_{trip}/I_{read}$ value is still 11.8% better than that of the RV cell 10.

Figure 12:
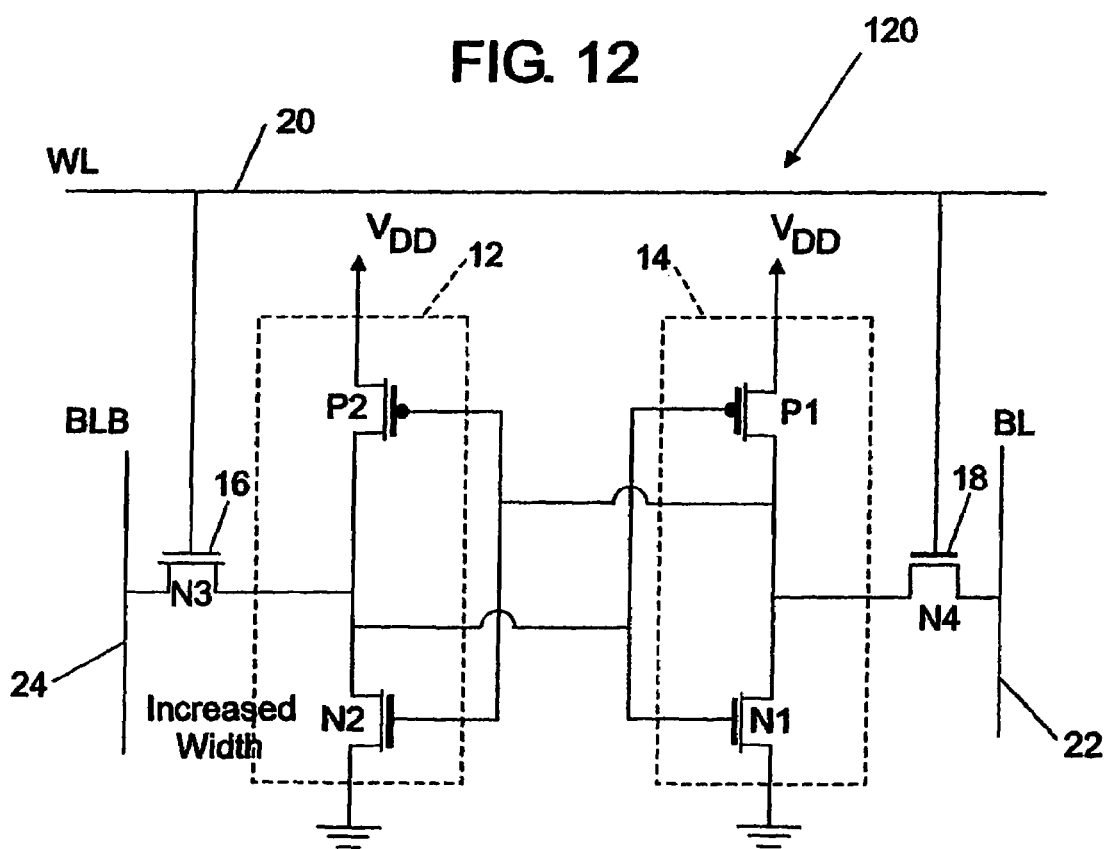
FIG. 12 illustrates a circuit diagram of an asymmetric SRAM cell configured to address leakage and speed through differences in transistor sizing, according to one embodiment of the present invention.

For the LE cell 40 increasing the width of N2 allows the conductance of N2 to approach that of N3 16, which leads to an increase in $I_{trip}$, thus increasing $I_{trip}/I_{read}$. By increasing N2's width by 22%, (leading to an only 2.4% increase in cell area) the $I_{trip}/I_{read}$ value of the new Resized Leakage Enhanced (RLE) cell 120 (FIG. 12) was made to be 2.28, which is comparable to the $I_{trip}/I_{read}$ value of 2.26 of the RV cell 10. The increase in N2's width also increases the SNM of the RLE cell 120 where the margins are now 0.349V and 0.280V instead of 0.363V and 0.246V.

As expected, the leakage performance of the resized cells is better than that of the SLE 90 and SSE 100 cells. For the RLE cell 120 the leakage reduction when holding a '1' remains unchanged at a 6.96× reduction relative to RV cell 10, but the leakage reduction when holding a '0' only slightly reduces from 69.5× to 57.9×. The SLE cell's 90 leakage reduction when holding a '0' was only 2.5×. When the RSE cell 110 is holding a '0' the leakage reduction stays at 2.04× relative to RV cell 10, and when it is holding a '1' the leakage reduction only changes from 6.96× to 6.79×. This change is also minimal when compared to the SSE cell's 100 leakage reduction of 1.9 1×.

Due to the increased size of the pull-down NMOS transistors, the resized cells have the potential of improving the read-access time of the cell. For the RLE cell 120 the discharge time along BLB remains at a 61.1% increase over the RV cell's 10 BLB discharge time, but the BL discharge time is now only 3.7% longer than the RV cell's 10 discharge time. As noted previously, only the BL discharge time is important due to the timed read based on a new sense amplifier. For the RSE cell 110, the discharge time along the fast side of the cell, BL, does not change, but the discharge time along BLB is reduced from the SE cell's 70 61.7% increase over RV cell 10 to a 49.2% increase over RV cell 10. This extra performance along BLE plays no important role in the cell's performance. As for the write times, the RLE cell's 120 write time increases to a 39% increase over RV cell's 10 write time from LE cell's 40 3 5.95% increase. The RSE cell's 110 write time jumps to a 45% increase over RV cell's 10 write times.

The stability analysis has also been performed on the resized cells for both the SNM test and $I_{trip}/I_{read}$ test. Both resized cells perform better than the RV cell in the worst case, and under Monte-Carlo analysis for the SNM. Under the $I_{trip}/I_{read}$ test, the RLE cell 120 now performs better than RV cell 10 both in the worst-case and on average. The increase in N1's size accomplishes the higher $I_{trip}/I_{read}$. The RSE cell's 110 $I_{trip}/I_{read}$ value also increases slightly under all tests, even surpassing the SE cell's 70 $I_{trip}/I_{read}$ value in the worst case. With a larger pull-down transistor, the process variations do not have as much an effect on the RSE cell's 110 stability.

Another figure of merit for the different cells is their stability under different supply voltages. For the technology being used, the nominal supply voltage is 1.2V. Monte-Carlo analysis has been performed for the RV 10, LE 40, SLE 90, RLE 120, SE 70, SSE 100 and RSE 110 cells for supply voltages ranging from 0.75V to 1.6V.

For voltages above 1.2V, LE 40, SLE 90 and RLE 120 improve their SNM advantage over the RV cell 10. With a higher VGS, the difference in conductance between the pass-gate (N3) and pull-down (N2) transistors, which was the root cause of the low stability at 1.2V, diminishes. At higher voltages, the SNM of the SE 70 and SSE 100 cells starts to diminish just as the SNM of the RV cell 10 but at a lower rate. The SNM of the RSE cell 110 levels off at higher voltages.

With lower supply voltages, the SNM of the asymmetric cells starts to suffer. For the LE 40, SLE 90 and RLE 120 cells, the SNM decreases rapidly, but the SLE cell's 100 SNM remains comparable to that of RV cell 10, while the RLE cell's 120 SNM becomes comparable to that of the LE cell's 40. This decrease in stability is caused by the difference in conductance between regular voltage and higher voltage transistors at low VGS's. Furthermore, at low VGS, the extra conductance of the larger transistor in the RLE cell 120 does not have a large effect since the transistor is not fully on. The SNM of SE 70, SSE 100 and RSE 110 also decreases, but not as fast as that of the LE cell 40. Again, this decrease in SNM is due to the difference in conductance at low VGS's.

The same tests were performed for the $I_{trip}/I_{read}$ method with the result that the curves for all cells are much better behaved, The SE 70 and SSE 100 cells have a near 24% advantage over the RV cell at 0.75V and an 8% advantage at 1.65V. The LE 40 and SLE 90 cells have approximately a 16% decrease in $I_{trip}/I_{read}$ at 0.75V and are comparable at 1.65V to the RV cell 10. The resized cells behave slightly differently, with the RSE cell 110 having an 11.7% improvement at 1.65V and a 32.2% improvement at 0.75V. The RLE cell 120 has a 9.6% improvement at 1.65V and a 4% decrease at 0.75V.

Figure 13:
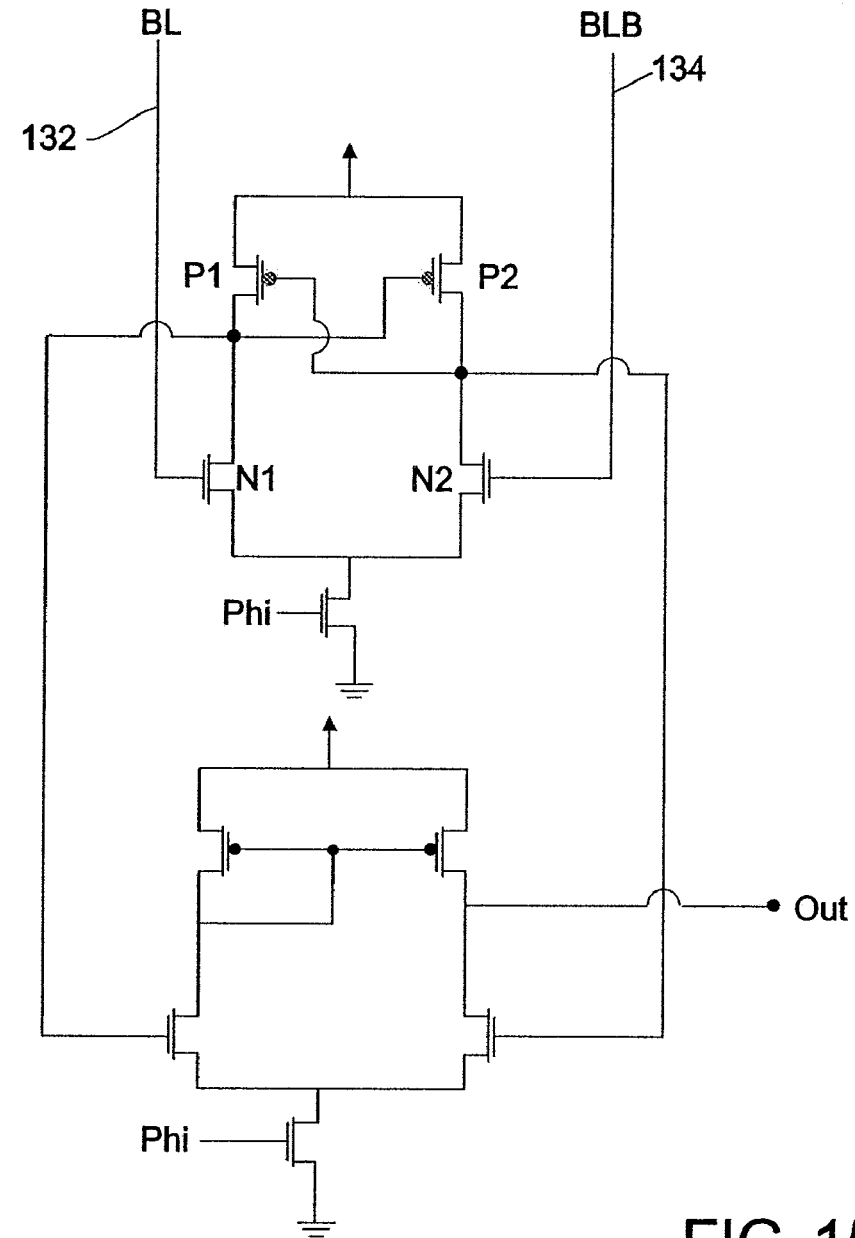
FIG. 13 illustrates a conventional sense amplifier.
Figure 14:
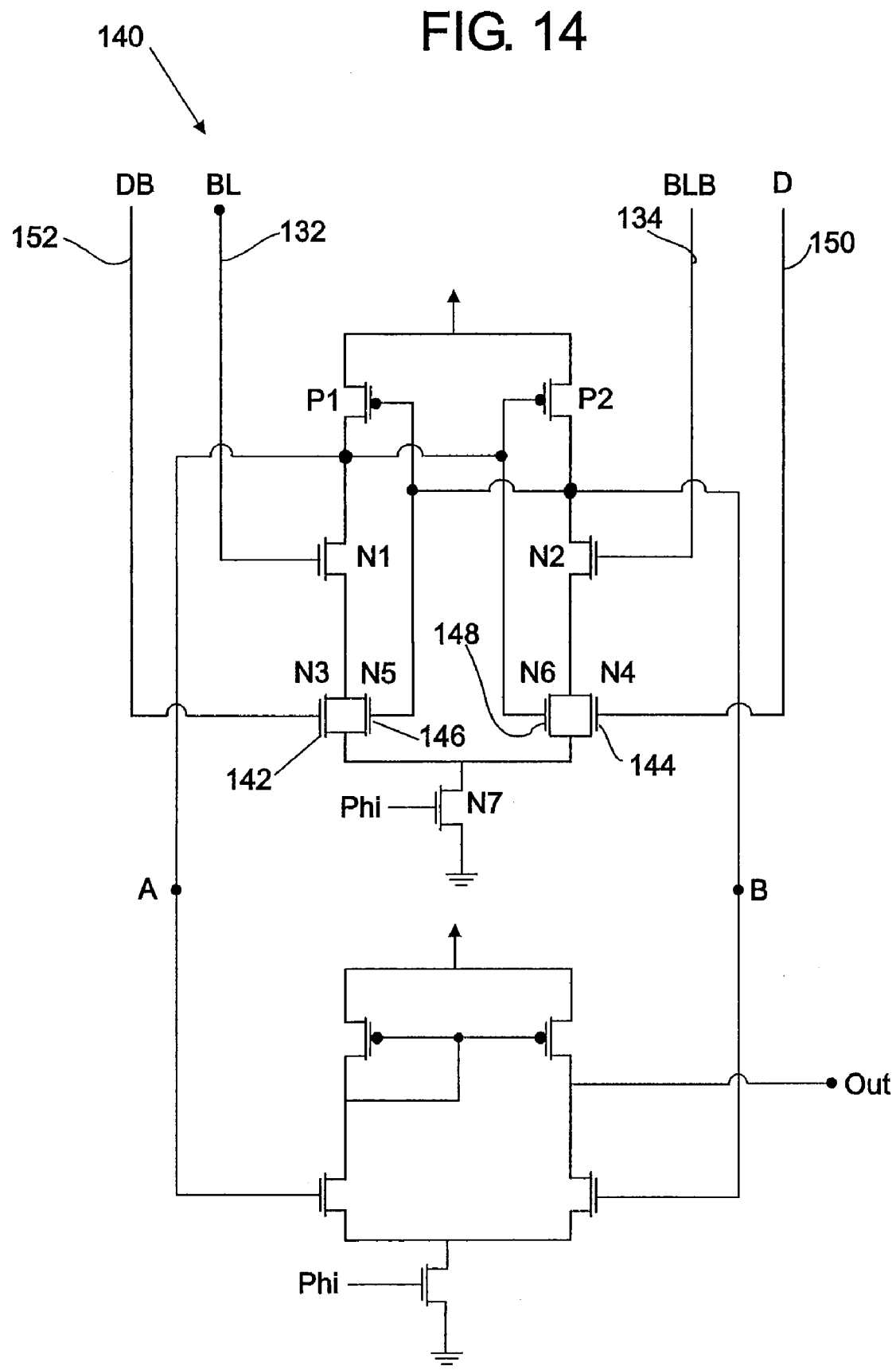
FIG. 14 illustrates a sense amplifier, according to one embodiment of the present invention.

A conventional sense amplifier 130 is shown in FIG. 13. It is not suitable for the present invention due to the slow access time when the cell is storing a '0'. To obtain fast read times regardless of the data value, a new sense amplifier 140 has been designed and is shown in FIG. 14. Compared to the conventional sense amplifier 130, the new sense amplifier 140 has four additional transistors 142, 144, 146, 148 and an area increase of roughly 0.229 μm² or 14.4%.

In addition to BL 132 and BLB 134, the sense amplifier 140 has two new inputs, D 150 and DB 152. These are connected to a dummy column of cells that store '1' at all time, but which are otherwise exactly identical to all other cells in the array. This dummy column extends the full length of the SRAM array such that during every read operation, one of the dummy cells will have its wordline asserted. Since the dummy cells always store a '1', they are always fast on the discharge (as fast as the fast side of any other cell), and they are used to provide something like a timer signal. This is achieved by connecting the dummy bitlines 150, 152 to the sense amplifier 140 in a reverse way. D 150 is connected to the right side, where BLB 134 is connected, and DB 152 is connected to the left side, where BL 132 is connected. This enables D 150 and DB 152 to trigger a fast read of a '0' result when the cell being read has a '0' content.

Sensing a '1' is as fast as a conventional sense amplifier 130 since this is done by sensing a discharge of BLB 134 due to the action of the fast side of the cell. Sensing a '0' is initiated at a later time than it would be in a conventional sense amplifier 130 to allow sufficient time for the fast side to trigger the sense amplifier 140 if it has to do so. While initiating the sensing for a '0' is delayed, the combined effect of the dummy cell and the slow side of the asymmetric cell makes the sensing process itself much faster once initiated, so that the end result becomes available at about the same time as it would when sensing a '1'.

The detailed operation of the sense amplifier 140 is as follows. Initially, the bitlines 132, 134 are precharged and all four amplifier inputs rise to $V_{DD}$. During this phase the sense amplifier 140 is being reset and nodes A and B are reset to an intermediate value. During a read operation, either BLB 134 will discharge (cell has a '1', fast discharge from the fast side) or BL 132 will discharge (cell has a '0', slow discharge from the slow side). Furthermore the signal DB 152, which is on the fast side of the dummy cell, will be discharged since the dummy cells permanently hold a logic '1'. If BLB 134 is being discharged a logic '1' is being sensed and the differential pair comprised of N1 and N2 causes increased current to pass through the left branch, thus increasing the voltage at node B and decreasing the voltage at node A. Through the positive feedback loop of P1, P2, N5, and N6, the rate of change for nodes A and B are increased to achieve quick sensing. When BL 132 is being discharged a logic '0' is being sensed. It does so at a slower rate since it is being discharged from the slow side of the asymmetric cell. To achieve fast sensing in this case, the dummy bitlines 150, 152, which are connected to the differential pair of N3 and N4, initiate the sensing of a logic '0'. Through the combined effect of DB 152 and BL 132 being discharged, albeit at a slower rate, approximately symmetric sense times are achieved.

For this sensing scheme to achieve reliable results it must allow for adequate time for BLB 134 to discharge before initiating a logic '0' read. This safety factor is achieved in two ways. First, the dummy bitlines 150, 152 are connected to all sense amplifiers and therefore have a slightly higher capacitive load compared to real bitlines 132, 134 leading to a slower discharge on DB 152 compared to BLB 134. The extra capacitive loading does not slow the sense time when BL 132 is discharging because of the concerted effort between BL 132 and DB 152 to sense the same value. Second, the transistors connected to the bitlines 132, 134 are wider than the transistors connected to the dummy bitlines 150, 152 leading to a higher transconductance and higher gain from the bitlines 132, 134 to the output than from the dummy bitlines 150, 152.

To limit the sense power, the sense amplifiers are clocked. The sense clock turns on the amplifiers and sets them up in their high gain region before the sensing occurs. To improve yield and ensure low-power operation, the clock path is matched to the data path. Matching is achieved by using an extra set of dummy bitlines to match the bitline delay and clock the sense amplifiers at the appropriate time.

Using the above cells and the sense amplifier 140 presented above, a 32-Kbyte SRAM example was designed and simulated to measure leakage, and read and write times.

Each of the 128 SRAM sub-arrays contains 64 cells along each bitline, and 32 cells along each wordline. The SRAM was simulated at a temperature of 110° C. with the RV cell 10, basic asymmetric, LE 40, SLE 90, RLE 120, SE 70, SSE 100, RSE 110 and HV 25 cells. Furthermore, the RV 10 and HV cells 25 were simulated with a conventional sense amplifier 130, and these results were used as a reference for our design.

The leakage trends seen above for the single cell remain true for the complete SRAM, where the LE 40 and SE 70 cells offer a reduction of 70× and 2× while storing a '0' and a reduction of about 7× when storing a '1.' The stability improved cells, and the resized cells also show the same leakage trends from the single cell experiments.

The total SRAM read access time includes four components: 1) input register propagation delay and hold times; 2) the address decoding delay; 3) the delay for wordline, bitline and sensing; and 4) the output register setup time. Only the delay for wordline, bitline and sensing is affected by the cell design. Specifically, this time is the time period from when precharging is complete to when the sense amplifier has reached 90% of its swing.

While the discharge times are asymmetric, the worst-case sensing times are on par with the RV cell with a conventional sense amplifier 130. Compared with the RV cell 10 with a conventional sense amplifier 130, the LE cell 40 is 10% slower. The effect on the total read time is an increase of just under 5%, however. The SE cell 70 is slightly faster not because the sense amplifier 140 is quicker, but because the bitline discharge time for the SE cell 70 is 50 ps quicker than that of the RV cell 10, which is a by-product of the asymmetry of the SE cell 70. Furthermore, the RLE cell 120 has a worst-case sense time that is 2.5% slower than the RV cell 10, with the effect on total read time being near 1%. Interestingly, the HV cell 25 with a conventional sense amplifier 130 would be 26% slower.

An important side comment to be made is that the new sense amplifier 140 does not speed up the sensing for the RV 10 and HV 25 cells when compared to the sensing with the conventional sense amplifier. Indeed, the RV 10 and HV 25 cells with the new sense amplifier 140 have worst-case sense times that are 5% slower than the sense times with the conventional sense amplifier 130. Thus, in comparing the speed of the new cells with the new sense amplifier 140 to the conventional cells with the conventional sense amplifier 130, the comparison is fair and valid, because the new sense amplifier 140 on its own does not speed up the read access time of the conventional cells.

The LE 40 and SE 70 cells exhibit a write time increase of 19.4% and 25.3% respectively over the RV cell 10. The SLE 90 and SSE 100 cells exhibit an increase of 28.4% and 13.4% respectively, and the RLE 120 and RSE 110 exhibit an increase of 22.4% and 27.6% respectively. The increase in write times is of minor importance since the write times are all shorter than the read times of the associated cells and therefore the speed of the SRAM is dependent on the read time.

The present invention also analyzes two cache organizations that use asymmetric cell designs: statically biased and dynamic inversion. In the statically biased cache, the cells are simply replaced with asymmetric ones. This cache is statically biased to dissipate low leakage power only when it stores the preferred bit value '0'. What makes this cache successful is typical program behavior that exhibits a strong bias towards zero. Specifically, we observed that a level-1 data cache had an average 78.7% zeros in the data stream, and a level-1 instruction cache had an average of 62.9% zeros. Given this, the statically biased cache with the SE cells reduces leakage by 4.5× and 3.8× for an instruction and a data cache, respectively, compared to conventional symmetric cell caches. The caches are 39 Kbyte 4-way set associative caches. While programs with a higher fraction of '1's than '0's may exist, our SRAM would still dissipate much lower leakage power compared to the regular Vt cell cache.

Figure 15:
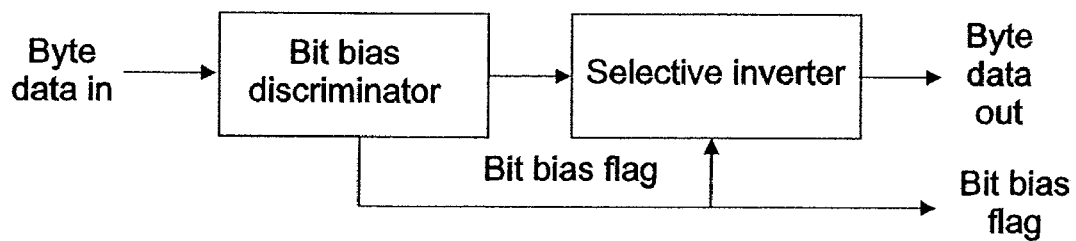
FIG. 15 illustrates a data flow diagram illustrating using selective inversion of byte data to optimize use of asymmetric SRAM cells, according to one embodiment of the present invention.

In selective inversion, the values stored within a block can be inverted at a byte granularity (other granularities are possible). In this design, if a byte contains five or more ones it is inverted prior to storing it in the cache. This cache needs an additional inversion flag cell per byte that holds information on which bytes were inverted. Inversion happens at write time. Since stores are typically buffered in a write buffer and are only sent to the data cache on commit, there is plenty of time to decide and apply inversion if necessary. A logic flow diagram for this procedure is illustrated in FIG. 15.

The present invention presents a novel approach that combines both circuit and architecture level techniques for drastically reducing leakage power dissipation. A key observation behind the present invention is that cache-resident memory values of ordinary programs exhibit a strong bias towards zero or one at the bit level. The present invention has introduced a family of high-speed asymmetric dual-Vt SRAM cell designs that exploit this bit-level bias to reduce leakage power while maintaining high performance.

Various asymmetric cells offer different performance/leakage/stability characteristics. The SE cell reduces leakage power by at least 2× and by 7× in the preferred state. It is as fast as the conventional, RV, SRAM cell. By comparison, the LE cell reduces leakage by at least 7× and by about 70× in the preferred state. Its total read time is only 5% higher than the SE and RV cells. These latter two cells have lower stability than LE under both the SNM and the $t_{trip}/I_{read}$ tests. Four other cells that compensate for stability were also designed, two by choosing different combinations of threshold voltages for the cell transistors, and two by changing some transistor sizes. The SSE cell reduces leakage power by 1.9× and 2.3× in the preferred state with no performance degradation, and the SLE cell reduces leakage power by 2.3× and 7× in the preferred state with only a 5% increase in read access times. The SSE and SLE cells have comparable stability to the RV cell. The RLE cell reduces leakage by 58× in the preferred state and by 7× in the other state with only a 1% increase in read access time, and an area increase of about 2.4%. The RSE cell reduces leakage by about 7× in the preferred state, and 2× in the other state. It has no performance degradation, but has an area increase of about 2.9%. The RLE and RSE cells have comparable stability to the RV cell. By comparison, an all high Vt cell reduces leakage power by about 70× while its bitline discharge time is 60% slower than the SE and RV cells.

The present invention also presents two cache organizations that use either a static bias towards zero, or dynamic, selective inversion to maximize the number of cache bits that are zero. While the reduction possible with either technique depends on application behavior, the statically biased cache with the SE cells reduces leakage by 4.5× and 3.8× for an instruction and a data cache, respectively, as compared to conventional symmetric-cell caches.

The preceding description has focused on SRAM cell designs that were comprised of six transistors. The principles of the present invention were described and applied to a six transistor design for ease of illustration. It should be noted, however, that the same asymmetric principles of the present invention may also be applied to other SRAM cell designs including, but not limited to, those comprised of four transistors and two resistors.

It is the asymmetric nature of the present invention that provides the novelty and uniqueness rather than a particular SRAM architecture. Thus, SRAM cell designs, as well as sense amplifiers and SRAM devices comprised of arrays of SRAM cells, that exhibit asymmetric transistor design characteristics are considered within the scope of the present invention.

Specific embodiments of an invention are described herein. One of ordinary skill in the circuit design and computing arts will quickly recognize that the invention has other applications in other environments. In fact, many embodiments and implementations are possible. The following claims are in no way intended to limit the scope of the invention to the specific embodiments described above.

We claim:

1. A sense amplifier for coupling with an asymmetric SRAM cell that provides faster access times when the asymmetric SRAM cell stores a first predetermined binary value, said sense amplifier comprised of:
    a first pair of cross coupled inverters across a bitline (BL) and a bitline bar (BLB);
    a second pair of cross coupled inverters operably coupled with the first pair of cross coupled inverters;
    a plurality of additional transistors forming a dummy column of cells that store a second predetermined binary value at all times wherein during a read operation of the SRAM cell one of the dummy cells will have its wordline asserted, said dummy column of cells operably coupled with the first pair of cross coupled inverters; and
    four inputs operably coupled with a subset of transistors of the sense amplifier wherein the inputs include the BL, the BLB that derive from the SRAM cell, a dummy bit line (D), and a dummy bitline bar (DB) that are input to the dummy cells such that D is input to the sense amplifier on the same side as BLB while DB is input to the sense amplifier on the same side as BL.

2. The sense amplifier of claim 1 wherein at least one of the transistors coupled with BL and BLB have higher transconductance characteristics than at least one of the transistors coupled with D and DB.

3. The sense amplifier of claim 1 wherein at least one of the transistors coupled with BL and BLB are selected from among the group consisting of:
    transistors having a lower voltage threshold ($V_t$) as compared to the voltage threshold ($V_t$) of the transistors coupled with D and DB;
    transistors having a increased channel width as compared to the channel width of the transistors coupled with D and DB; and
    transistors having a decreased channel length as compared to the channel length of the transistors coupled with D and DB.

4. A combination SRAM device and sense amplifier comprising:
    an array of SRAM cells wherein each SRAM cell stores a binary variable representing a predetermined binary value, and wherein each SRAM cell is an asymmetric SRAM cell having reduced leakage power with respect to a comparable symmetric SRAM cell, each asymmetric SRAM cell comprising:
        a plurality of transistors operably coupled and configured as an asymmetric SRAM cell, wherein the plurality of transistors include at least one of a first type of transistor and at least one of a second type of transistor that is weaker than the first type of transistor, such that the configuration of each asymmetric SRAM cell achieves reduced leakage power with respect to a symmetric SRAM cell having the first type of transistor only; and
    at least one sense amplifier comprised of:
        a first pair of cross coupled inverters across a bitline (BL) and a bitline bar (BLB);
        a second pair of cross coupled inverters operably coupled with the first pair of cross coupled inverters;
        a plurality of additional sense amplifier transistors forming a dummy column of cells that store a second predetermined binary value at all times wherein during a read operation of the SRAM cell one of the dummy cells will have its wordline asserted, said dummy column of cells operably coupled with the first pair of cross-coupled inverters; and
        four inputs operably coupled with a subset of the sense amplifier transistors wherein the inputs include the BL, the BLB that derive from the SRAM cell, a dummy bit line (D), and a dummy bitline bar (DB) that are input to the dummy cells such that D is input to the sense amplifier on the same side as BLB while DB is input to the sense amplifier on the same side as BL.

5. The combination SRAM device and sense amplifier of claim 4 wherein the sense amplifier transistors coupled with BL and BLB have higher transconductance characteristics than the sense amplifier transistors coupled with D and DB.

6. The combination SRAM device and sense amplifier of claim 4 wherein at least one of the sense amplifier transistors coupled with BL and BLB are selected from among the group consisting of:
    transistors having a lower voltage threshold ($V_t$) as compared to the voltage threshold ($V_t$) of the transistors coupled with D and DB;
    transistors having a increased channel width as compared to the channel width of the transistors coupled with D and DB; and
    transistors having a decreased channel length as compared to the channel length of the transistors coupled with D and DB.

7. The combination SRAM device and sense amplifier of claim 4 wherein the SRAM device comprises an SRAM device selected from the group consisting of a direct store SRAM device and a selectively inverted SRAM device.

8. The combination SRAM device and sense amplifier of claim 7 wherein the array of SRAM cells in the SRAM device comprises a cache memory selected from the group consisting of a direct store cache memory and a selectively inverted cache memory.

* * * * *